(12) United States Patent
Liu

(10) Patent No.: US 11,239,110 B2
(45) Date of Patent: Feb. 1, 2022

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jiquan Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/865,906

(22) Filed: May 4, 2020

(65) Prior Publication Data

US 2020/0357683 A1 Nov. 12, 2020

(30) Foreign Application Priority Data

May 9, 2019 (CN) .......................... 201910385409.2

(51) Int. Cl.
*H01L 21/768* (2006.01)
*H01L 21/311* (2006.01)
(Continued)

(52) U.S. Cl.
CPC .. *H01L 21/76802* (2013.01); *H01L 21/31111* (2013.01); *H01L 21/31144* (2013.01);
(Continued)

(58) Field of Classification Search
CPC ......... H01L 21/76802; H01L 21/31111; H01L 23/5226; H01L 21/31144; H01L 23/5283; H01L 21/76877; H01L 21/76849; H01L 21/76829; H01L 21/76834; H01L 21/76897; H01L 21/76898; H01L 21/76814; H01L 21/7685; H01L 23/5384
See application file for complete search history.

(56) References Cited

U.S. PATENT DOCUMENTS 8,901,627 B2 * 12/2014 Wu ........................ H01L 23/585
257/288
2004/0002212 A1 * 1/2004 Choi ................. H01L 21/76829
438/687

(Continued)

*Primary Examiner* — Karen Kusumakar
(74) *Attorney, Agent, or Firm* — Anova Law Group, PLLC

(57) ABSTRACT

Semiconductor structure and method for forming semiconductor structure are provided. A substrate is provided, including a first dielectric layer, a first conductive layer and a second conductive layer. A first stop layer is formed on a top surface of the first conductive layer and a top surface of the second conductive layer, and a second stop layer is formed on a surface of the first dielectric layer. A second dielectric layer is formed on a surface of the first stop layer and a surface of the second stop layer. A first opening and a second opening are formed in the second dielectric layer by etching a portion of the second dielectric layer until the surface of the first stop layer is exposed. The first opening exposes the first stop layer on the first conductive layer, and the second opening exposes the first stop layer on the second conductive layer.

20 Claims, 6 Drawing Sheets

(51) Int. Cl.
*H01L 23/522* (2006.01)
*H01L 23/528* (2006.01)

(52) U.S. Cl.
CPC .... *H01L 21/76877* (2013.01); *H01L 23/5226* (2013.01); *H01L 23/5283* (2013.01)

(56) References Cited

U.S. PATENT DOCUMENTS

| | | | | |
|---|---|---|---|---|
| 2014/0077305 | A1* | 3/2014 | Pethe | H01L 23/5226 257/368 |
| 2014/0327140 | A1* | 11/2014 | Zhang | H01L 23/53266 257/751 |
| 2016/0379881 | A1* | 12/2016 | He | H01L 21/76832 257/774 |
| 2019/0259650 | A1* | 8/2019 | Han | H01L 23/53209 |

* cited by examiner

SEMICONDUCTOR STRUCTURE AND FORMING METHOD THEREOF

CROSS-REFERENCES TO RELATED APPLICATIONS

This application claims priority of Chinese Patent Application No. 201910385409.2, filed on May 9, 2019, the entire content of which is hereby incorporated by reference.

FIELD OF THE DISCLOSURE

The present disclosure generally relates to the field of semiconductor manufacturing and, more particularly, relates to a semiconductor structure and a forming method thereof.

BACKGROUND

With development of integrated circuits toward very-large-scale integrated circuits, circuit density of an integrated circuit is getting higher, and quantity of components included in an integrated circuit is increasing. In this case, a wafer surface may not provide an enough area for disposing required interconnect lines.

To meet demand for interconnect lines after size reduction of components, designs of multi-layer metal interconnects with two or more layers become a method commonly used in very-large-scale integration technologies. At present, a method of forming a metal plug includes transferring a circuit pattern to a dielectric layer between a metal layer and a metal layer or between a metal layer and a substrate by using photolithography, forming a via in the dielectric layer, and filling the via with metal, and performing chemical mechanical planarization.

However, as a size of a semiconductor structure continuously reduces, accuracy of a conventional photolithographic process may not meet accuracy requirements of metal plugs with increasingly circuit density, and performance of a semiconductor structure formed may be undesirable.

The disclosed methods and structures are directed to solve one or more problems set forth above and other problems in the art.

BRIEF SUMMARY OF THE DISCLOSURE

One aspect of the present disclosure includes a method for forming a semiconductor structure. The method includes providing a substrate, including a first dielectric layer, a first conductive layer located in the first dielectric layer and a second conductive layer located in the first dielectric layer. The first dielectric layer exposes a top surface of the first conductive layer and a top surface of the second conductive layer, and the first conductive layer and the second conductive layer are separated from each other. The method also includes forming a first stop layer on the top surface of the first conductive layer and the top surface of the second conductive layer, respectively, and forming a second stop layer on a surface of the first dielectric layer. The first stop layer and the second stop layer are made of different materials, and the second stop layer is made of an insulating material. The method also includes forming a second dielectric layer on a surface of the first stop layer and a surface of the second stop layer, and forming a first opening and a second opening in the second dielectric layer by etching a portion of the second dielectric layer until the surface of the first stop layer is exposed. The first opening exposes the first stop layer on the top surface of the first conductive layer, and the second opening exposes the first stop layer on the top surface of the second conductive layer.

Another aspect of the present disclosure includes a semiconductor structure. The semiconductor structure includes a substrate, including a first dielectric layer, a first conductive layer located in the first dielectric layer and a second conductive layer located in the first dielectric layer. The first dielectric layer exposes a top surface of the first conductive layer and a top surface of the second conductive layer, and the first conductive layer and the second conductive layer are separated from each other. The semiconductor structure also includes a first stop layer on a first portion of the top surface of the first conductive layer, exposing a second portion of the top surface of the first conductive layer, and on a first portion of the top surface of the second conductive layer, exposing a second portion of the top surface of the second conductive layer, respectively. The semiconductor structure also includes a second stop layer on a portion of a surface of the first dielectric layer between the first and second conductive layers, and a second dielectric layer on the first stop layer and the second stop layer. The semiconductor structure also includes a first conductive plug, formed on the second portion of the top surface of the first conductive layer, on a first surface portion of the second stop layer, and through the second dielectric layer, and a second conductive plug, formed on the second portion of the top surface of the second conductive layer, on a second surface portion of the second stop layer, and through the second dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

In a conventional technology, a conductive layer may be prone to generate leakage current with a conductive plug formed subsequently.

FIGS. 1 to 4 illustrate sectional diagrams of semiconductor structures corresponding to certain stages of a process of forming a semiconductor structure.

Figure 1:
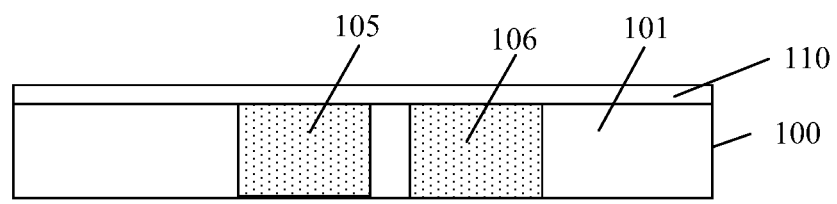
FIGS. 1 to 4 illustrate sectional diagrams of semiconductor structures corresponding to certain stages of a process of forming a semiconductor structure.

As shown in FIG. 1, a substrate 100 is provided. The substrate 100 includes a first dielectric layer 101, a first conductive layer 105 within the first dielectric layer 101, and a second conductive layer 106 within the first dielectric layer 101. A stop layer 110 is disposed on a surface of the substrate 100.

Figure 2:
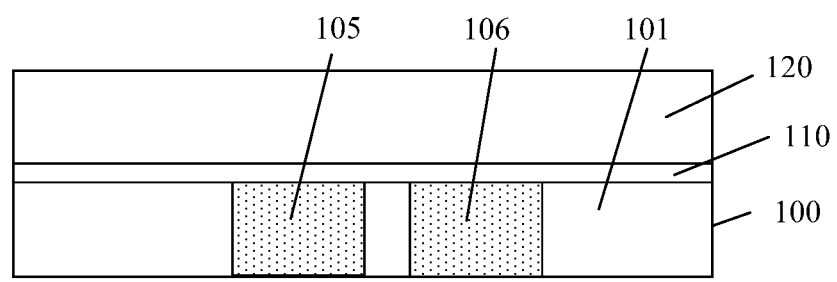
Figure 3:
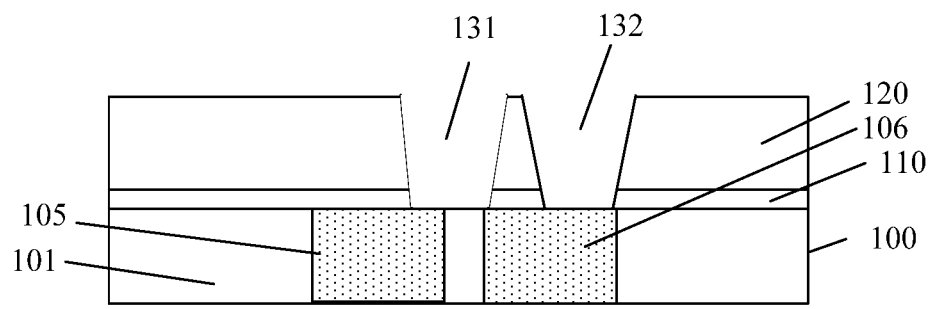

Referring to FIG. 2, a second dielectric layer 120 is disposed on a surface of the stop layer 110. Referring to FIG. 3, a portion of the second dielectric layer 120 and the stop layer 110 is removed by etching. A first opening 131 and a second opening 132 are formed in the second dielectric layer 120 and the stop layer 110. The first opening 131 exposes a surface of the first conductive layer 105, and the second opening 132 exposes a surface of the second conductive layer 106.

Figure 4:
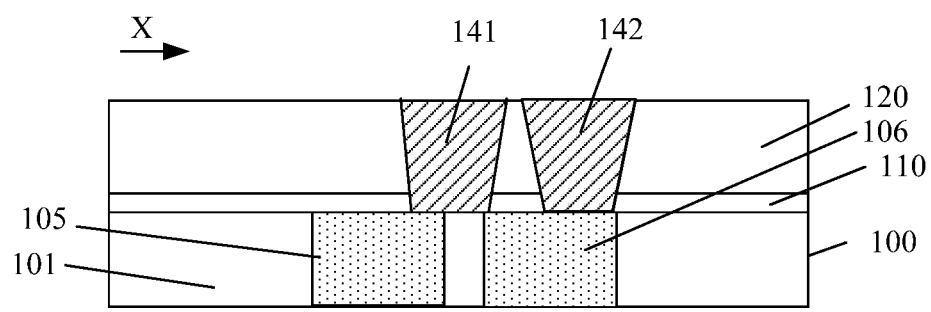

Referring to FIG. 4, a first conductive plug 141 is formed in the first opening 131 (shown in FIG. 3), and a second conductive plug 142 is formed in the second opening 132 (shown in FIG. 3).

In the above conventional method, a portion of the second dielectric layer 120 and the stop layer 110 are removed by etching, accordingly, the first opening 131 formed exposes the surface of the first conductive layer 105 and the second opening 132 exposes the surface of the second conductive layer 106. As such, the first conductive plug 141 located in the first opening 131 may be in contact with the first conductive layer 105, and the second conductive plug 142 located in the second opening 132 may be in contact with the second conductive layer 106. Electrical connection may thus be achieved.

However, a conventional photolithography process may not guarantee that the first opening 131 and the second opening 132 formed are completely consistent with designed circuit patterns. That is, the first opening 131 may shift toward or away from the second conductive layer 106 in a first direction X, or the second opening 132 may shift toward or away from the first conductive layer 105 in the first direction X. Further, as a circuit density in an integrated circuit becomes higher, a distance between the first conductive layer 105 and the second conductive layer 106 may become smaller. When the first opening 131 shifts toward the second conductive layer 106 in the first direction X, a distance between the first opening 131 and the second conductive layer 106 may become smaller. As such, the first conductive plug 141 formed in the first opening 131 may be prone to generate a punch-through effect with the second conductive layer 106, resulting in generation of leakage current. When the second opening 132 shifts toward the first conductive layer 105 in the first direction X, the distance between the second opening 132 and the first conductive layer 105 may become smaller. As such, the second conductive plug 142 formed in the second opening 132 may be prone to generate a punch-through effect with the first conductive layer 105, resulting in generation of leakage current. As such, performance of a semiconductor structure formed by a conventional method may be undesirable. It should be noted that the first direction X refers to an arrangement direction of the first conductive layer 105 and the second conductive layer 106.

To solve the above technical problems, the present disclosure provides a method for forming a semiconductor structure. The method includes: forming a first stop layer on a surface of a first conductive layer and a surface of a second conductive layer, respectively; forming a second stop layer on a surface of a first dielectric layer, where the first stop layer and the second stop layer are made of different materials, and the second stop layer is made of an insulating material; forming a second dielectric layer on a surface of the first stop layer and a surface of the second stop layer; etching a portion of the second dielectric layer until the surface of the first stop layer is exposed, forming a first opening and a second opening in the second dielectric layer. The first opening exposes the first stop layer on the surface of the first conductive layer, and the second opening exposes the first stop layer on the surface of the second conductive layer. A semiconductor structure formed by the method may have good performance.

Figure 19:
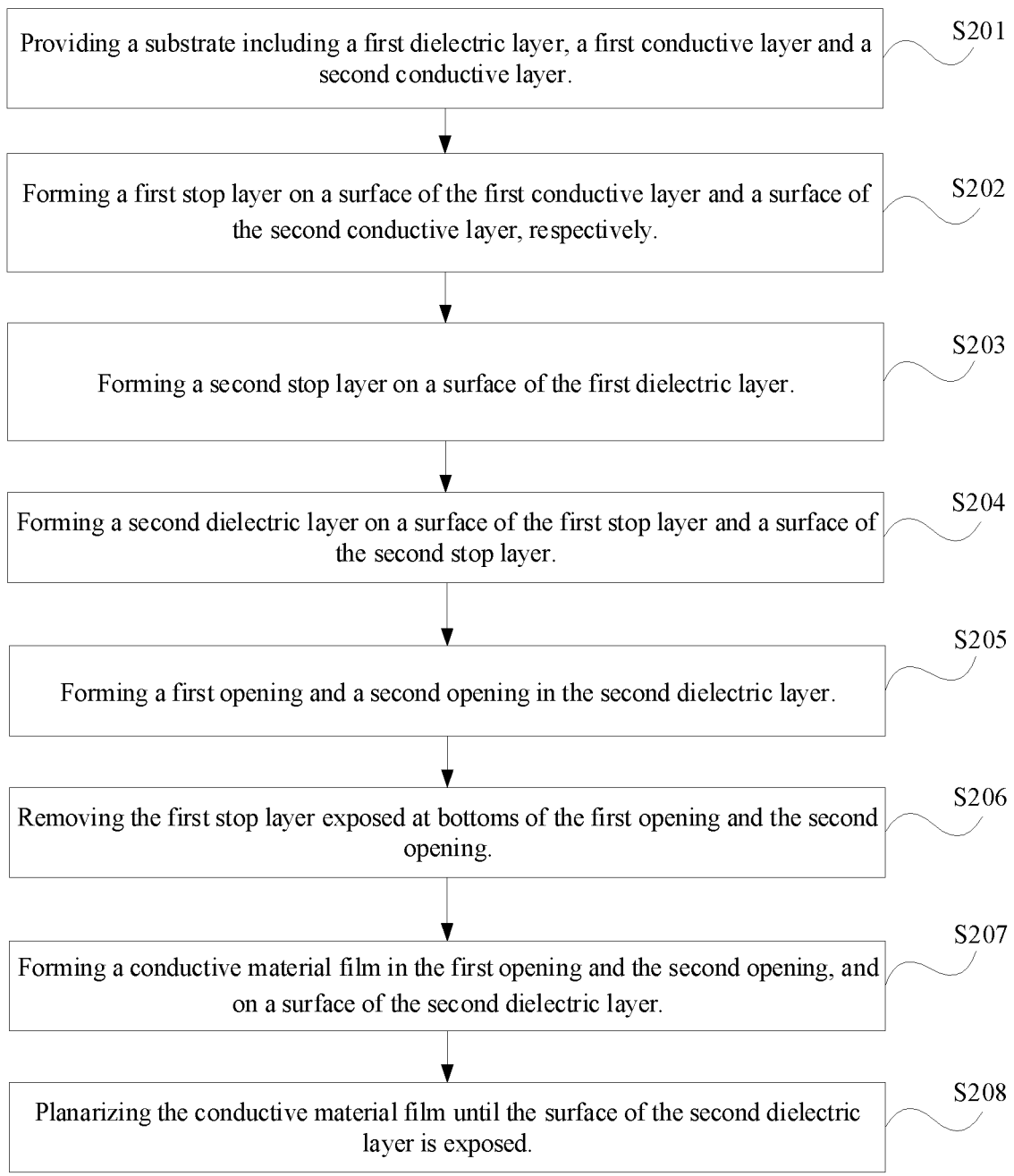
FIG. 19 illustrates an exemplary process of forming a semiconductor structure consistent with the disclosed embodiments of the present disclosure.

FIG. 19 illustrates an exemplary process of forming a semiconductor structure consistent with the disclosed embodiments of the present disclosure. FIGS. 5 to 12 illustrate sectional diagrams of semiconductor structures corresponding to certain stages of the exemplary process of forming a semiconductor structure consistent with the disclosed embodiments of the present disclosure.

Figure 5:
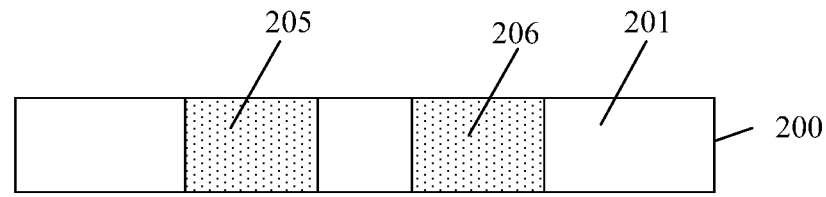
FIGS. 5 to 12 illustrate sectional diagrams of semiconductor structures corresponding to certain stages of an exemplary process of forming a semiconductor structure consistent with the disclosed embodiments of the present disclosure.

As shown in FIG. 19, at the beginning of the process, a substrate is provided (S201). FIG. 5 illustrates a corresponding semiconductor structure.

Referring to FIG. 5, a substrate 200 is provided. The substrate 200 includes a first dielectric layer 201, a first conductive layer 205 located in the first dielectric layer 201, and a second conductive layer 206 located in the first dielectric layer 201. The first dielectric layer 201 exposes a top surface of the first conductive layer 205 and a top surface of the second conductive layer 206. The first conductive layer 205 and the second conductive layer 206 are separated from each other.

The first conductive layer 205 and the second conductive layer 206 are made of a material including tungsten, copper, aluminum, silver, chromium, molybdenum, nickel, palladium, platinum, titanium, or tantalum. In one embodiment, the first conductive layer 205 and the second conductive layer 206 are made of tungsten.

The first dielectric layer 201 is made of a material including a low-K dielectric material or an ultra-low dielectric material (K<3.9). In one embodiment, the first dielectric layer 201 is made of silicon oxide.

Figure 6:
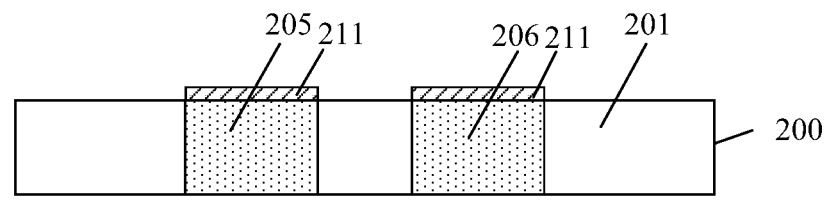

Returning to FIG. 19, after providing the substrate, a first stop layer may be formed on the surface of the first conductive layer and the surface of the second conductive layer, respectively (S202). FIG. 6 illustrates a corresponding semiconductor structure.

Referring to FIG. 6, a first stop layer 211 is formed on the surface of the first conductive layer 205 and the surface of the second conductive layer 506, respectively.

The first stop layer 211 is made of a conductive material, including titanium, tungsten, or cobalt. In one embodiment, the first stop layer 211 is made of tungsten. A process of forming the first stop layer 211 includes a selective deposition process.

The first stop layer 211 may serve as an etching stop layer for subsequently forming a first opening and a second opening, such that etching on the surface of the first conductive layer 205 and the surface of the second conductive layer 206 may be avoided.

Figure 7:
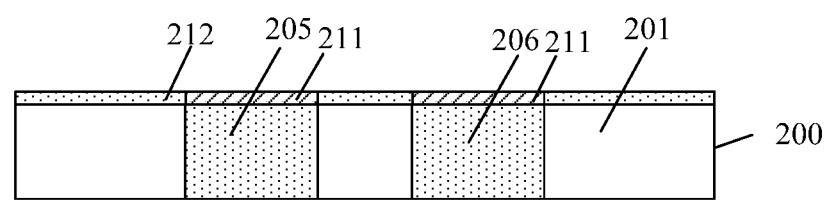

Returning to FIG. 19, after forming the first stop layer, a second stop layer may be formed on a surface of the first dielectric layer (S203). FIG. 7 illustrates a corresponding semiconductor structure.

Referring to FIG. 7, a second stop layer 212 is formed on the surface of the first dielectric layer 201. The first stop layer 211 and the second stop layer 212 are made of different materials, and the second stop layer 212 is made of an insulating material. The second stop layer 212 is made of a material including SiN, $TiO_2$, TiN, AlN or $Al_2O_3$. In one embodiment, the second stop layer 212 is made of AlN. A process of forming the second stop layer 212 includes selective deposition.

In one embodiment, the first stop layer 211 is formed before the second stop layer 212 is formed. In some other embodiments, the first stop layer 211 may be formed after the second stop layer 212 is formed.

In the present disclosure, the first conductive layer 205 and the first dielectric layer 201 are made of different materials, and the second conductive layer 206 and the first dielectric layer 201 are made of different materials. Accordingly, by controlling deposition process parameters, the first stop layer 211 may be deposited on the surface of the first conductive layer 205 and the surface of the second conductive layer 206, and the first stop layer 211 may not be deposited on the surface of the first dielectric layer 201. In addition, the second stop layer 212 may be deposited on the surface of the first dielectric layer 201, and the second stop layer 212 may not be deposited on the surface of the first conductive layer 205 and the surface of the second conductive layer 206.

The second stop layer 212 is made of an insulating material. On one hand, the second stop layer 212 may be used as an etching stop layer for subsequent formation of the first opening and the second opening, such that etching the surface of the first dielectric layer 201 between the first conductive layer 205 and the second conductive layer 206 may be avoided. On the other hand, the second stop layer 212 may improve an electrical isolation effect between the first plug subsequently formed in the first opening and the second conductive layer 206, and may also improve an electrical isolation effect between the second plug subsequently formed in the second opening and the first conductive layer 205. As such, generation of leakage current may be avoided, and the semiconductor structure formed may have good performance.

When the first stop layer 211 is made of a conductive material, the first plug formed subsequently in the first opening may be electrically connected to the first conductive layer 205, and the second plug formed subsequently in the second opening may be electrically connected to the second conductive layer 206.

Figure 8:
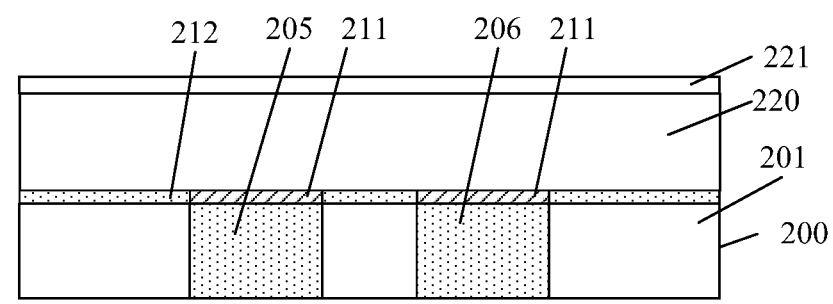

Returning to FIG. 19, after forming the second stop layer, a second dielectric layer may be formed on a surface of the first stop layer and a surface of the second stop layer (S204). FIG. 8 illustrates a corresponding semiconductor structure.

Referring to FIG. 8, after the first stop layer 211 and the second stop layer 212 are formed, a second dielectric layer 220 is formed on a surface of the first stop layer 211 and a surface of the second stop layer 212.

The second dielectric layer 220 is made of a material including silicon oxide, silicon nitride, silicon nitride carbide, silicon nitride boride, silicon carbon nitride oxide, or silicon nitride oxide. In one embodiment, the second dielectric layer 220 is made of silicon oxide.

A process of forming the second dielectric layer 220 includes a chemical vapor deposition process and a physical vapor deposition process. The second dielectric layer 220 may be used to subsequently form a first opening and a second opening.

In one embodiment, after forming the second dielectric layer 220, the method further includes forming a hard mask layer 221 on a surface of the second dielectric layer 220. The hard mask layer 221 may be made of a material including SiN, $TiO_2$, TiN, AlN or $Al_2O_3$. In one embodiment, the hard mask layer 221 is made of silicon nitride. The hard mask layer 221 may be used as a patterned mask layer for an etching process for subsequently forming the first opening and the second opening.

Figure 9:
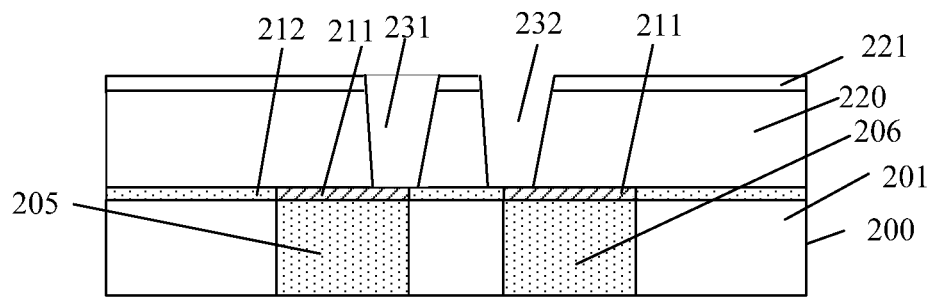

Returning to FIG. 19, after forming the second dielectric layer, a portion of the second dielectric layer may be removed by etching, forming the first opening and the second opening in the second dielectric layer (S205). FIG. 9 illustrates a corresponding semiconductor structure.

Referring to FIG. 9, a portion of the second dielectric layer 220 may be removed by etching, and the first opening 231 and the second opening 232 are thus formed in the second dielectric layer 220. The first opening 231 exposes the surface of the first stop layer 211 on the surface of the first conductive layer 205, and the second opening 232 exposes the surface of the first stop layer 211 on the surface of the second conductive layer 206.

A process for forming the first opening 231 and the second opening 232 includes: forming a patterned layer (not shown in FIG. 9) on a surface of the hard mask layer, where the patterned layer exposes the second dielectric layer 220 on the surface of the first conductive layer 205 and the surface of the second conductive layer 206; by using the patterned layer as a mask, etching the hard mask layer 221 to form a patterned hard mask layer 221; and by using the patterned hard mask layer 221 as a mask, etching the second dielectric layer 220 until the surface of the first stop layer 211 is exposed, forming the first opening 231 and the second opening 232 in the second dielectric layer 220.

A process of etching the hard mask layer 221 includes one or a combination of a dry etching process and a wet etching process. A process of etching the second dielectric layer 220 includes one or a combination of a dry etching process and a wet etching process.

In one embodiment, the process of etching the second dielectric layer 220 and the process of etching the hard mask layer 221 are same, and both are an anisotropic dry etching process.

In one embodiment, the first stop layer 211 is made of a conductive material. After forming the first opening 231 and the second opening 232, the method may also include removing the first stop layer 211 exposed at bottoms of the first opening 231 and the second opening 232.

In some other embodiments, after forming the first opening and the second opening, the first stop layer exposed at the bottoms of the first opening and the second openings may not be removed. Since the first stop layer 211 is made of a conductive material, a first conductive plug may be formed in the first opening, and a second conductive plug may be formed in the second opening.

Figure 10:
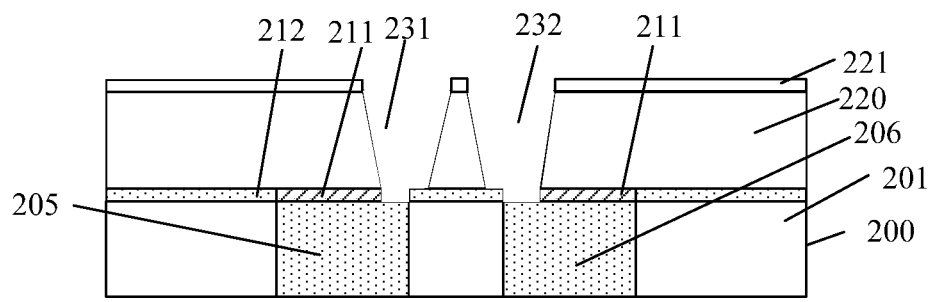

Returning to FIG. 19, after forming the first opening and the second opening in the second dielectric layer, the first stop layer exposed at bottoms of the first opening and the second opening may be removed (S206). FIG. 10 illustrates a corresponding semiconductor structure.

Referring to FIG. 10, the first stop layer 211 exposed at the bottom of the first opening 231 is removed by etching until the top surface of the first conductive layer 205 is exposed. The first stop layer 211 exposed at the bottom of the second opening 232 is removed by etching until the top surface of the second conductive layer 206 is exposed.

A process of removing the first stop layer 211 exposed at the bottoms of the first opening 231 and the second opening 232 by the etching includes one or a combination of a wet etching process and a dry etching process.

For the process of removing the first stop layer 211 exposed at the bottoms of the first opening 231 and the second opening 232 by etching, an etching rate of the first stop layer 211 may be greater than an etching rate of the second stop layer 212.

In one embodiment, the process of removing the first stop layer 211 exposed at the bottoms of the first opening 231 and the second opening 232 by etching is a wet etching process.

Since the first stop layer 211 exposed at the bottom of the first opening 231 is removed by etching, a bottom of the first conductive plug formed subsequently may contact the surface of the first conductive layer 205. Since the first stop layer 211 exposed at the bottom of the second opening 232 is removed by etching, a bottom of the second conductive plug formed subsequently may contact the surface of the second conductive layer 206.

In addition, for the process of removing the first stop layer 211 exposed at the bottoms of the first opening 231 and the second opening 232 by etching, the etching rate of the first stop layer 211 may be larger than the etching rate of the second stop layer 212. Accordingly, maybe only the first stop layer 211 is removed, while the second stop layer 212 may not be removed. As such, generation of leakage current may be avoided, resistance between the first conductive plug formed subsequently and the first conductive layer 205 may be reduced, and resistance between the second conductive plug formed subsequently and the second conductive layer 206 may be reduced. The semiconductor structure formed may thus have good performance.

With continuous reference to FIG. 10, after the first opening 231 and the second opening 232 are formed, the method also includes removing impurities on the bottoms and sidewall surfaces of the first opening 231 and the second opening 232. A process of removing the impurities on the bottoms and the sidewall surfaces of the first opening 231 and the second opening 232 includes one or a combination of a wet etching process and a dry etching process.

By removing the impurities adhering on the bottoms and the sidewall surfaces of the first opening 231 and the second opening 232, conductivity of the first conductive plug and the second conductive plug formed subsequently may be improved, and the semiconductor structure formed may thus have good performance.

In one embodiment, the process of removing the first stop layer 211 exposed at the bottoms of the first opening 231 and the second opening 232 by etching and the process of removing the impurities on the bottoms and the sidewall surfaces of the first opening 231 and the second opening 232 are a same wet etching process. Accordingly, a fabrication process of the method may be simplified.

After the first opening 231 and the second opening 232 are formed, a first conductive plug may be formed in the first opening 231 and a second conductive plug may be formed in the second opening 232 subsequently. For a specific process of forming the first conductive plug and the second conductive plug, reference may be made to FIGS. 11 to 12.

Figure 11:
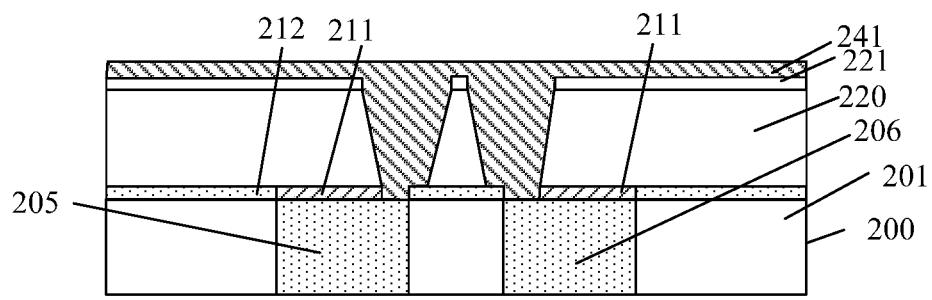

Returning to FIG. 19, after removing the first stop layer exposed at the bottoms of the first opening and the second opening, a conductive material film may be formed in the first opening and the second opening, and on the surface of the second dielectric layer 220 (S207). FIG. 11 illustrates a corresponding semiconductor structure.

Referring to FIG. 11, a conductive material film 241 is formed in the first opening 231 and the second opening 232, and on the surface of the second dielectric layer 220. The conductive material film 241 fills the first opening and the second opening.

After the first opening 231 and the second opening 232 are formed, and before the conductive material film 241 is formed, the method may also include forming a barrier material film (not shown in FIG. 11) on the bottom and the sidewall surface of the first opening 231, the bottom and the sidewall surface of the second opening 232, and the surface of the second dielectric layer 220. The conductive material film 241 is located on a surface of the barrier material film.

In one embodiment, the barrier material film is located on the bottom and the sidewall surface of the first opening 231, the bottom and the sidewall surface of the second opening, and the surface of the hard mask layer 221.

The barrier material film may be used for subsequently forming a barrier layer. The conductive material film 241 may be used for subsequently forming a first conductive plug and a second conductive plug.

A process for forming the conductive material film 241 includes a chemical vapor deposition process, a physical vapor deposition process, or an electroplating process.

In one embodiment, the conductive material film 241 includes a seed material film (not shown in FIG. 11) and a conductive film (not shown in FIG. 11) on a surface of the seed material film.

A process for forming the conductive material film 241 includes: depositing the seed material film in the first opening 231 and the second opening 232, and on the surface of the second dielectric layer 220; after depositing the seed material film, forming the conductive film on a surface of the seed material film by an electroplating process. The conductive film fills the first opening 231 and the second opening 232.

Specifically, the barrier material film is formed in the first opening 231 and the second opening 232, and on the surface of the hard mask layer 221. After the barrier material film is formed, the seed material film is formed on the surface of the barrier material film. After the seed material film is formed, the conductive film is formed on the surface of the seed material film. The conductive film fills the first opening 231 and the second opening 232.

The conductive material film 241 is made of a material including: tungsten, copper, aluminum, silver, chromium, molybdenum, nickel, palladium, platinum, titanium, or tantalum. Correspondingly, the conductive plugs subsequently formed are made of a material including: tungsten, copper, aluminum, silver, chromium, molybdenum, nickel, palladium, platinum, titanium, or tantalum. In one embodiment, the conductive material film 241 is made of tungsten.

Figure 12:
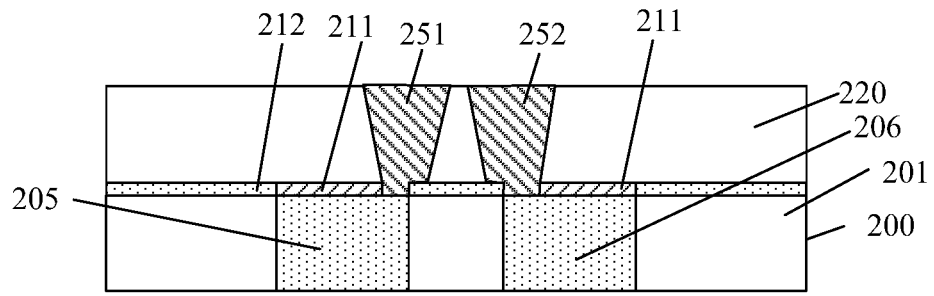

Returning to FIG. 19, after forming the conductive material film, the conductive material film may be planarized until the surface of the second dielectric layer is exposed (S208). FIG. 12 illustrates a corresponding semiconductor structure.

Referring to FIG. 12, the conductive material film 241 is planarized until the surface of the second dielectric layer 220 is exposed, forming a first conductive plug 251 in the first opening 231 and a second conductive plug 252 in the second opening 232.

In one embodiment, the method also includes planarizing the conductive material film 241 and the barrier material film until the surface of the hard mask layer 221 is exposed, forming the first conductive plug 251 in the first opening 231 and the second conductive plug 252 in the second opening in 232.

Specifically, after the barrier material film, the seed material film, and the conductive material film 241 are formed, the conductive material film 241, the seed material film, and the barrier material film are planarized until the surface of the second dielectric layer 220 is exposed. Thus, the first conductive plug 251 is formed in the first opening 231, and the second conductive plug 252 is formed in the second opening 232.

In one embodiment, the first conductive plug 251 includes a first seed layer (not shown in FIG. 12) located on the bottom and the sidewall surface of the first opening 231, and the first conductive layer (not shown in FIG. 12) located on a surface of the first seed layer. The second conductive plug 252 includes a second seed layer (not shown in FIG. 12) located at the bottom and the sidewall surface of the second opening 232, and the second conductive layer (not shown in FIG. 12) located on a surface of the second seed layer.

A process of planarizing the conductive material film 241, the seed material film, and the barrier material film includes a chemical mechanical polishing process.

In the present disclosure, the second stop layer 212 is disposed on the surface of the first dielectric layer 201 between the first conductive layer 205 and the second conductive layer 206. The second stop layer 212 is made of an insulating material. Accordingly, the second stop layer 212 may improve the isolating effect between the first conductive plug 251 and the second conductive layer 206, and the isolating effect between the second conductive plug 252 and the first conductive layer 205. Further, the second stop layer 212 may reduce a possibility of the punch-through effect between the first conductive layer 205 and the second conductive plug 252, and reduce the possibility of the punch-through effect between the second conductive layer 206 and the first conductive plug 251. As such, generation of leakage current may be avoided, and a semiconductor structure formed may have good performance.

Correspondingly, the present disclosure also provides a semiconductor structure formed by using the above method provided by the present disclosure. For details of the semiconductor structure, reference may be made to FIG. 12.

FIGS. 13 to 18 illustrate sectional diagrams of semiconductor structures corresponding to certain stages of another exemplary process of forming a semiconductor structure consistent with the disclosed embodiments of the present disclosure. The difference between the exemplary process illustrated in FIGS. 13 to 18 and the exemplary process illustrated in FIGS. 5 to 12 is that the first stop layers of the two exemplary processes are made of different materials.

Figure 13:
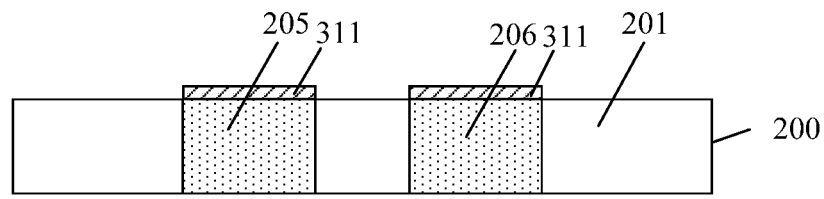
FIGS. 13 to 18 illustrate sectional diagrams of semiconductor structures corresponding to certain stages of another exemplary process of forming a semiconductor structure consistent with the disclosed embodiments of the present disclosure.

Referring to FIG. 13 on basis of FIG. 5, a first stop layer 311 is formed on a surface of the first conductive layer 205 and a surface of the second conductive layer 206, respectively. The first stop layer 311 is made of an insulating material.

The first stop layer 311 is made of a material including SiN, $TiO_2$, TiN, AlN, or $Al_2O_3$. In one embodiment, the first stop layer 311 is made of $Al_2O_3$. A process of forming the first stop layer 311 includes a selective deposition process.

Figure 14:
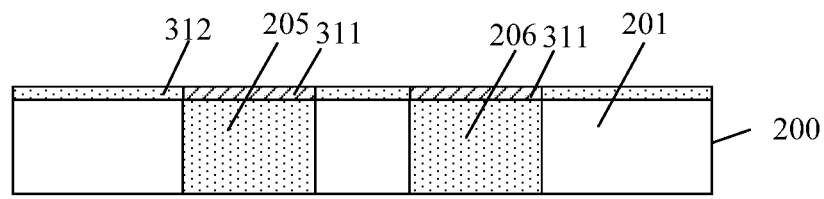

Referring to FIG. 14, a second stop layer 312 is formed on a surface of the first dielectric layer 201. The first stop layer 311 and the second stop layer 312 are made of different materials, and the second stop layer 312 is made of an insulating material. The second stop layer 312 is made of a material including SiN, $TiO_2$, TiN, AlN or $Al_2O_3$. In one embodiment, the second stop layer 312 is made of AlN. A process of forming the second stop layer 312 includes selective deposition.

In the present disclosure, the first conductive layer 205 and the first dielectric layer 201 are made of different materials, and the second conductive layer 206 and the first dielectric layer 201 are made of different materials. Accordingly, by controlling deposition process parameters, the first stop layer 311 may be deposited on the surfaces of the first conductive layer 205 and the second conductive layer 206, and the first stop layer 311 may not be deposited on the surface of the first dielectric layer 201. In addition, the second stop layer 312 may be deposited on the surface of the first dielectric layer 201, and the second stop layer 312 may not be deposited on the surface of the first conductive layer 205 and the surface of the second conductive layer 206.

Figure 15:
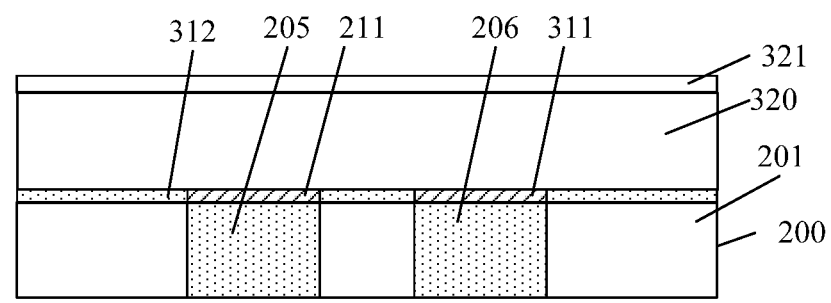

Referring to FIG. 15, after the first stop layer 311 and the second stop layer 312 are formed, a second dielectric layer 320 is formed on a surface of the first stop layer 311 and a surface of the second stop layer 312.

In one embodiment, after forming the second dielectric layer 320, the method also includes forming a hard mask layer 321 on a surface of the second dielectric layer 320.

A material and a forming process of the second dielectric layer 320 are same as the material and the forming process of the second dielectric layer 220 illustrated in FIG. 8, and details are not described herein again.

A material and a forming process of the hard mask layer 321 are same as the material and the forming process of the hard mask layer 221 illustrated in FIG. 8, and details are not described herein again.

Figure 16:
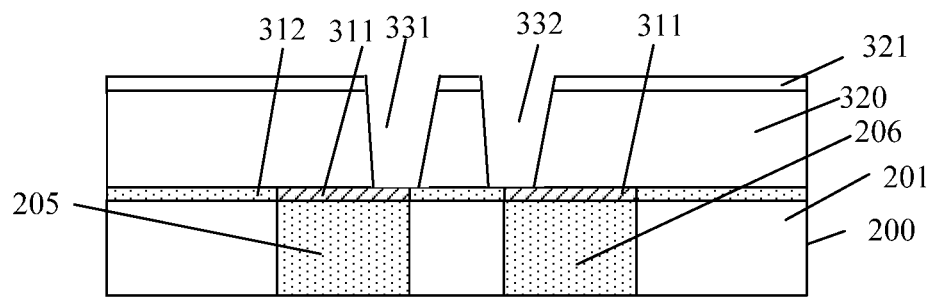

Referring to FIG. 16, a portion of the second dielectric layer 320 is etched until the surface of the first stop layer 311 is exposed, and a first opening 331 and a second opening 332 are thus formed in the second dielectric layer 320. The first opening 331 exposes the first stop layer 311 on the surface of the first conductive layer 205, and the second opening 332 exposes the first stop layer 311 on the surface of the second conductive layer 206.

A process of etching the portion of the second dielectric layer 320 includes one or a combination of a dry etching process and a wet etching process. In one embodiment, the process of etching the portion of the second dielectric layer 320 is an anisotropic dry etching process.

Since the first stop layer 311 is made of an insulating material, after the first opening 331 and the second opening 332 are formed, the first stop layer 311 exposed by the first opening 331 needs to be removed until the first conductive layer 205 is exposed. Also, the first stop layer 311 exposed by the second opening 332 needs to be removed until the second conductive layer 206 is exposed. In this way, a first conductive plug subsequently formed may be electrically connected to the first conductive layer 205, and a second conductive plug subsequently formed may be electrically connected to the second conductive layer 206.

Figure 17:
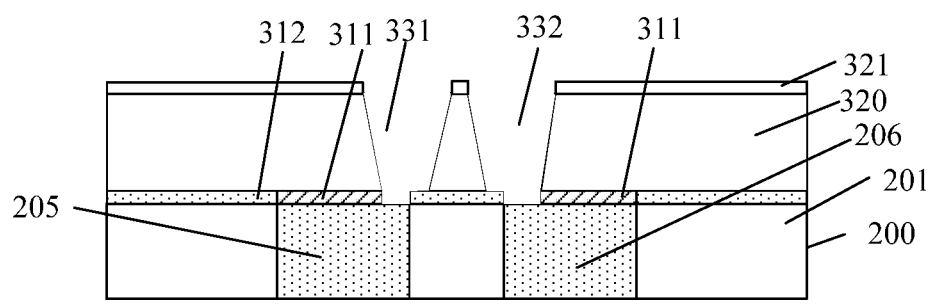

Referring to FIG. 17, after the first opening 331 and the second opening 332 are formed, the first stop layer 311 exposed by the first opening 331 is removed until the first conductive layer 205 is exposed, and the first stop layer 311 exposed by the second opening 332 is removed until the second conductive layer 206 is exposed.

A process of removing the first stop layer 311 exposed by the first opening 331 and the second opening 332 includes one or a combination of a dry etching process and a wet etching process.

In one embodiment, after the first opening 331 and the second opening 332 are formed, the method also includes removing impurities on bottom surfaces and sidewall surfaces of the first opening 331 and the second opening 332 by etching.

An etching process for removing the impurities on the bottom surfaces and the sidewall surfaces of the first opening 331 and the second opening 332 includes one or a combination of a wet etching process and a dry etching process. In one embodiment, the etching process of removing the impurities on the bottom surfaces and the sidewall surfaces of the first opening 331 and the second opening 332 is a wet etching process.

By removing the impurities adhering on the bottoms and sidewall surfaces of the first opening 331 and the second opening 332, conductivity of the first conductive plug and the second conductive plug formed subsequently may be improved. The semiconductor structure formed may thus have good performance.

Figure 18:
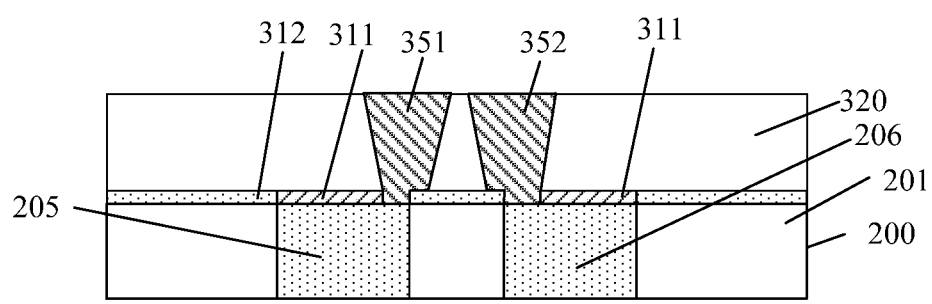

Referring to FIG. 18, after removing the first stop layer 311 exposed by the first opening 331 and the second opening 332, a first conductive plug 351 may be formed in the first opening 331 and a second conductive plug 352 may be formed in the second opening 332.

A process of forming the first conductive plug 351 and the second conductive plug 352 is same as the process of forming the first conductive plug 251 and the second conductive plug 252 illustrated in FIG. 12, and details are not described herein again.

In the present disclosure, the second stop layer 312 is disposed on the surface of the first dielectric layer 201 between the first conductive layer 205 and the second conductive layer 206, and the second stop layer 312 is made of an insulating material. Accordingly, the second stop layer 312 may improve an isolating effect between the first conductive plug 351 and the second conductive layer 206, and may also improve an isolating effect between the second conductive plug 352 and the first conductive layer 205. Further, the second stop layer 312 may reduce a possibility of a punch-through effect between the first conductive layer 205 and the second conductive plug 352, and may also reduce a possibility of a punch-through effect between the second conductive layer 206 and the first conductive plug 351. Thus, generation of leakage current may be avoided, and the semiconductor structure formed may have good performance.

Correspondingly, the present disclosure also provides a semiconductor structure formed by the process illustrated in FIGS. 13-18. For details of the semiconductor structure, reference may be made to FIG. 18.

As disclosed, the technical solutions of the present disclosure have the following advantages.

In a method for forming a semiconductor structure provided by the present disclosure, a second stop layer is disposed on a surface of a first dielectric layer between a first conductive layer and a second conductive layer. The second stop layer is made of an insulating material. The second stop layer may improve an isolating effect between the first conductive plug and the second conductive layer, and may also improve an isolating effect between the second conductive plug and the first conductive layer. Further, the second stop layer may reduce a possibility of a punch-through effect between the first conductive layer and the second conductive plug, and may also reduce a possibility of a punch-through effect between the second conductive layer and the first conductive plug. Thus, generation of leakage current may be avoided, and a semiconductor structure formed may have good performance.

Further, when the first stop layer is made of a conductive material, a bottom of the first conductive plug may be in contact with the surface of the first conductive layer by removing the first stop layer exposed at the bottom of the first opening; a bottom of the second conductive plug may be in contact with the surface of the second conductive layer by removing the first stop layer exposed at the bottom of the second opening. In addition, a process of removing the first stop layer exposed at the bottoms of the first opening and the second opening may have an etching rate of the first stop layer that is greater than an etching rate of the second stop layer. Accordingly, maybe only the first stop layer is removed, and the second stop layer may not be removed. As such, generation of leakage current may be avoided, and meanwhile, resistance between the first conductive plug and the first conductive layer may be reduced, and resistance between the second conductive plug and the second conductive layer may be reduced. Performance of the semiconductor structure formed may thus be improved.

Further, by using an etching process, impurities on bottom surfaces and sidewall surfaces of the first opening and the second opening may be removed. Accordingly, conductivity of the first conductive plug and the second conductive plug formed subsequently may be improved, and the performance of the semiconductor structure formed may thus be improved.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method for forming a semiconductor structure, comprising:
   providing a substrate, including a first dielectric layer, a first conductive layer located in the first dielectric layer and a second conductive layer located in the first dielectric layer, wherein the first dielectric layer exposes a top surface of the first conductive layer and a top surface of the second conductive layer, and the first conductive layer and the second conductive layer are separated from each other;
   forming a first stop layer on the top surface of the first conductive layer and the top surface of the second conductive layer, respectively;
   forming a second stop layer on a surface of the first dielectric layer, wherein the first stop layer and the second stop layer have a same thickness alone a direction perpendicular to the top surface of the first conductive layer and are made of different materials, and the second stop layer is made of an insulating material;
   forming a second dielectric layer on a surface of the first stop layer and a surface of the second stop layer; and
   forming a first opening and a second opening in the second dielectric layer by etching a portion of the second dielectric layer until the surface of the first stop layer is exposed, wherein the first opening exposes the first stop layer on the top surface of the first conductive layer, and the second opening exposes the first stop layer on the top surface of the second conductive layer.

2. The method according to claim 1, wherein forming the first stop layer includes a selective deposition process.

3. The method according to claim 1, wherein forming the second stop layer includes a selective deposition process.

4. The method according to claim 1, wherein the first stop layer is made of a conductive material.

5. The method according to claim 4, further comprising:
forming a first conductive plug in the first opening and a second conductive plug in the second opening.

6. The method according to claim 5, after forming the first opening and the second opening, and before forming the first conductive plug and the second conductive plug, further comprising:
removing the first stop layer exposed at a bottom of the first opening by etching until the top surface of the first conductive layer is exposed; and
removing the first stop layer exposed at a bottom of the second opening by etching until the top surface of the second conductive layer is exposed,
wherein:
the first conductive plug is in contact with the top surface of the first conductive layer, and the second conductive plug is in contact with the top surface of the second conductive layer.

7. The method according to claim 6, wherein:
for removing the first stop layer exposed at the bottoms of the first opening and the second opening by etching, an etching rate of the first stop layer is greater than an etching rate of the second stop layer; and
the etching for removing the first stop layer exposed at the bottoms of the first opening and the second opening includes a wet etching process.

8. The method according to claim 4, wherein the first stop layer is made of a material including titanium, tungsten, cobalt, or a combination thereof.

9. The method according to claim 1, after forming the second dielectric layer, and before forming the first opening and the second opening, further comprising forming a hard mask layer on a surface of the second dielectric layer, wherein:
forming the first opening and the second opening includes:
forming a patterned layer on a surface of the hard mask layer, wherein the patterned layer exposes the second dielectric layer on the top surface of the first conductive layer and the top surface of the second conductive layer;
forming a patterned hard mask layer by etching the hard mask layer using the patterned layer as an etch mask; and
forming the first opening and the second opening in the second dielectric layer by etching the second dielectric layer until the surface of the first stop layer is exposed, using the patterned hard mask layer as an etch mask.

10. The method according to claim 1, wherein:
for etching a portion of the second dielectric layer, an etching rate of the second dielectric layer is greater than an etching rate of the first stop layer, and the etching rate of the second dielectric layer is greater than an etching rate of the second stop layer.

11. The method according to claim 1, after forming the first opening and the second opening, and before forming the first conductive plug and the second conductive plug, further comprising:
removing impurities on bottoms and sidewall surfaces of the first opening and the second opening, wherein:
removing the impurities on the bottoms and the sidewall surfaces of the first opening and the second opening includes a wet etching process.

12. A method for forming a semiconductor structure, comprising:
providing a substrate, including a first dielectric layer, a first conductive layer located in the first dielectric layer and a second conductive layer located in the first dielectric layer, wherein the first dielectric layer exposes a top surface of the first conductive layer and a top surface of the second conductive layer, and the first conductive layer and the second conductive layer are separated from each other;
forming a first stop layer on the top surface of the first conductive layer and the top surface of the second conductive layer, respectively, wherein the first stop layer is made of an insulating material;
forming a second stop layer on a surface of the first dielectric layer, wherein the first stop layer and the second stop layer are made of different materials, and the second stop layer is made of an insulating material;
forming a second dielectric layer on a surface of the first stop layer and a surface of the second stop layer; and
forming a first opening and a second opening in the second dielectric layer by etching a portion of the second dielectric layer until the surface of the first stop layer is exposed, wherein the first opening exposes the first stop layer on the top surface of the first conductive layer, and the second opening exposes the first stop layer on the top surface of the second conductive layer.

13. The method according to claim 12, after forming the first opening and the second opening, further comprising:
removing the first stop layer exposed by the first opening until the first conductive layer is exposed; and
removing the first stop layer exposed by the second opening until the second conductive layer is exposed.

14. The method according to claim 12, wherein the first stop layer is made of a material including SiN, $TiO_2$, TiN, AlN, $Al_2O_3$, or a combination thereof.

15. The method according to claim 13, after removing the first stop layer exposed by the first opening and the second opening, further comprising:
forming a first conductive plug in the first opening and forming a second conductive plug in the second opening.

16. The method according to claim 15, wherein forming the first conductive plug and the second conductive plug includes:
forming a conductive material film in the first opening and the second opening, and on the surface of the second dielectric layer, wherein the conductive material film fills the first opening and the second opening; and
forming the first conductive plug in the first opening and the second conductive plug in the second opening, by planarizing the conductive material film until the surface of the second dielectric layer is exposed.

17. The method according to claim 16 after forming the first opening and the second opening, and before forming the conductive material film, further comprising forming a barrier material film in the first opening and the second opening and on the surface of the second dielectric layer, wherein:
forming the first conductive plug and the second conductive plug further comprises, after forming the barrier material film, forming a barrier layer by planarizing the barrier material film.

18. The method according to claim 16, wherein:
the conductive material film includes a seed material film and a conductive film on a surface of the seed material film; and
forming the conductive material film comprises:
 forming the seed material film in the first opening and the second opening and on the surface of the second dielectric layer by deposition; and
 after forming the seed material film, forming the conductive film on a surface of the seed material film by an electroplating process, wherein the conductive film fills the first opening and the second opening.

19. A semiconductor structure, comprising:
a substrate, including a first dielectric layer, a first conductive layer located in the first dielectric layer and a second conductive layer located in the first dielectric layer, wherein the first dielectric layer exposes a top surface of the first conductive layer and a top surface of the second conductive layer, and the first conductive layer and the second conductive layer are separated from each other;
a first stop layer on a first portion of the top surface of the first conductive layer, exposing a second portion of the top surface of the first conductive layer, and on a first portion of the top surface of the second conductive layer, exposing a second portion of the top surface of the second conductive layer, respectively;
a second stop layer on a portion of a surface of the first dielectric layer between the first and second conductive layers, wherein the first stop layer and the second stop layer have a same thickness alone a direction perpendicular to the top surface of the first conductive layer;
a second dielectric layer on the first stop layer and the second stop layer;
a first conductive plug, formed on the second portion of the top surface of the first conductive layer, on a first surface portion of the second stop layer, and through the second dielectric layer; and
a second conductive plug, formed on the second portion of the top surface of the second conductive layer, on a second surface portion of the second stop layer, and through the second dielectric layer.

20. The structure according to claim 19, wherein:
the first stop layer and the second stop layer are made of different materials, and the second stop layer is made of an insulating material.

\* \* \* \* \*